(12) United States Patent
Chao

(10) Patent No.: US 7,034,589 B2
(45) Date of Patent: Apr. 25, 2006

(54) MULTI-STAGE DELAY CLOCK GENERATOR

(75) Inventor: Tze-Hsiang Chao, Hsin-Chu (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 10 days.

(21) Appl. No.: 10/708,373

(22) Filed: Feb. 26, 2004

(65) Prior Publication Data

US 2005/0189974 A1    Sep. 1, 2005

(51) Int. Cl.
*H03L 7/06* (2006.01)

(52) U.S. Cl. ........................ 327/158; 327/149
(58) Field of Classification Search ............ 327/149, 327/150, 153, 158, 159, 161, 163, 276; 331/17, 331/25, DIG. 2; 375/375, 376
See application file for complete search history.

(56) References Cited

U.S. PATENT DOCUMENTS

| 6,437,616 B1 * | 8/2002 | Antone et al. ............ 327/158 |
| 6,549,052 B1 * | 4/2003 | Okayasu ................... 327/276 |
| 6,693,473 B1 * | 2/2004 | Alexander et al. ......... 327/158 |
| 2003/0011414 A1 * | 1/2003 | Bell ......................... 327/233 |

* cited by examiner

*Primary Examiner*—Linh My Nguyen
(74) *Attorney, Agent, or Firm*—Winston Hsu

(57) ABSTRACT

The present invention provides a multi-stage delay clock generator including: a plurality of delay cells, each delay cell generating a delay signal to a subsequent delay cell in response to a delayed clock signal from a preceding delay cell and a delay control signal where a first delay cell among the plurality of delay cells receives an external clock signal, and each subsequent delay cell comprises a smaller delay step than the current delay cell; a phase detector, responsive to the external clock signal and a feedback clock signal, for generating a lock control signal; an integrator, responsive to the lock control signal, for generating the delay control signal; and a control unit for programming the delay cells.

18 Claims, 5 Drawing Sheets

MULTI-STAGE DELAY CLOCK GENERATOR

BACKGROUND OF INVENTION

1. Field of the Invention

The invention generally relates to clock generators, and more particularly, to a multi-stage delay lock loop for clock phase alignment.

2. Description of the Prior Art

Clock signals are used in virtually every integrated circuit (IC) to control the operational timing of the IC and/or the transfer of data within and between ICs. For example, all individual circuits or devices, such as, for example, flip-flops and/or latches, in a given IC may change state on a single rising or falling edge of a common clock signal. Relatively large ICs, such as, for example, memory chips, programmable logic arrays, or any other IC that requires clock skew adjustment, include thousands or even millions of such individual circuits or devices. The clock signal is typically applied to a clock input pin of the IC for distribution to each of those numerous devices throughout the IC. Thus, the clock signal is transmitted or propagated from the clock input pin to devices on the IC that are both relatively near to and relatively distant from the clock input pin. By the time the clock signal reaches the devices that are disposed on portions of the IC that are relatively remote from the input pin, the clock signal is likely to have suffered significant propagation delay.

The clock signal received at the IC clock input is hereinafter referred to as the input or reference clock signal REF_CLK, whereas the clock signal received by the last-served device on the IC is hereinafter referred to as the feedback clock signal FEED_CLK. The propagation delay between the REF_CLK and FEED_CLK signals, may cause difficulties in interfacing between ICs and/or slow down the overall operating speed of a system. For example, data may be provided or input to an IC in a time-aligned manner relative to the reference clock signal, whereas data output from the IC is likely to be provided in a time-aligned manner with the feedback clock signal.

The propagation delay for a particular IC is dependent at least in part upon the configuration of that particular IC. Thus, for a given IC operating at standard or rated operating conditions, temperatures, and voltages, delay will generally not vary substantially. However, delay will vary due to external factors, such as, for example, changes in ambient temperature, package temperature, and/or applied voltage. It is beneficial to compensate for the effect of such external factors on the propagation delay of the reference clock signal by aligning in time the feedback clock signal FEED_CLK of an IC with the reference clock signal REF_CLK. Delay lock loop circuits are one way in which such time alignment of signals is performed.

Delay lock loop (DLL) circuits receive the reference clock signal REF_CLK and produce an output clock signal CLK_OUT that is advanced or delayed relative to the reference clock signal REF_CLK. For convenience, all signals produced by a DLL will hereinafter be referred to as being delayed relative to the REF_CLK signal regardless of whether the particular signal is actually advanced or delayed relative to the reference clock signal. A DLL delays the output clock signal CLK_OUT by an amount of time that is approximately equal to the propagation delay of the IC, i.e., the amount of time required for the reference clock signal REF_CLK to propagate through the IC under standard or normal operating conditions. Further, a DLL adjusts the CLK_OUT signal to compensate for changes in delay due to the aforementioned external factors. Devices formed on portions of the IC that are proximate to the clock input pin are typically supplied with the REF_CLK signal, whereas devices formed on portions of the IC relatively distant from the input clock signal are typically supplied with the CLK_OUT signal. Thus, all devices on the IC receive clock signals that are aligned in time.

The DLL adjusts the amount of time by which the CLK_OUT signal is delayed relative to the REF_CLK signal by comparing the REF_CLK signal to a feedback clock signal FB_CLK. The FB_CLK signal is essentially a delayed version of the CLK_OUT signal. The FB_CLK signal is delayed by a feedback delay circuit that models the propagation delay through an integrated circuit. The time delay of the FB_CLK signal relative to the CLK_OUT signal is, for example, proportional or equal to the propagation delay of the IC under the predefined operating conditions. As the external factors affect the propagation delay through the IC, they also affect the time delay introduced by the feedback delay circuit.

The CLK_OUT signal is essentially a delayed version of the REF_CLK signal. The delay of the CLK_OUT signal is adjusted by a forward delay circuit having a forward delay line, such as, for example, a predetermined number of buffers or invertors connected together in series. The length of the forward delay line is adjusted based upon a comparison of the REF_CLK signal to the feedback clock signal FB_CLK, to thereby adjust the delay of the CLK_OUT signal and to align in time the CLK_OUT signal to the REF_CLK signal at the end of the clock tree. Thus, changes in the propagation delay due to the external factors are compensated for and the clock signals are time-aligned across a range of operating conditions and parameters.

In designing DLLs, a tradeoff between conflicting design goals has heretofore been required. The first design goal of a conventional DLL is to provide a maximum delay time approximately equal to the longest anticipated cycle time (i.e., the lowest operating frequency) of the REF_CLK signal to ensure alignment under worst-case operating conditions. The second design goal is to provide high resolution, i.e., small time increments, in the adjustment of the delay of the CLK_OUT signal, to maximize alignment of the clocks and, therefore, the operating speed of the IC. Satisfying both of those goals results in a DLL that requires a delay line with a large multitude of delay stages. A large multitude of delay stage new lots of controlling wire and complex controlling method..

Therefore, what is needed in the art is a DLL that achieves a relatively high resolution with relatively few controlling lines. Furthermore, what is needed in the art is a DLL that requires a small number of programming bits. Moreover, what is needed in the art is a DLL that allows a tunable sensing window for fast locking of clock phase.

SUMMARY OF INVENTION

It is therefore a primary objective of the claimed invention to provide a multi-stage clock generator.

According to the claimed invention, the present invention provides a multi-stage delay clock generator comprising: a plurality of delay cells, each delay cell generating a delay signal to a subsequent delay cell in response to a delayed clock signal from a preceding delay cell and a delay control signal where a first delay cell among the plurality of delay cells receives an external clock signal, wherein each subsequent delay cell comprises a smaller delay step than the current delay cell; a phase detector, responsive to the external clock signal and a feedback clock signal, for generating a lock control signal; and a control unit, responsive to the lock control signal, for generating the delay control signal for programming the delay cells.

The multi-stage clock generator of the present invention is suitable for multiple frequencies application by using much fewer programming bits with a self-calibrating process to cover any environmental changes such as manufacturing deviations and temperature and voltage variations.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
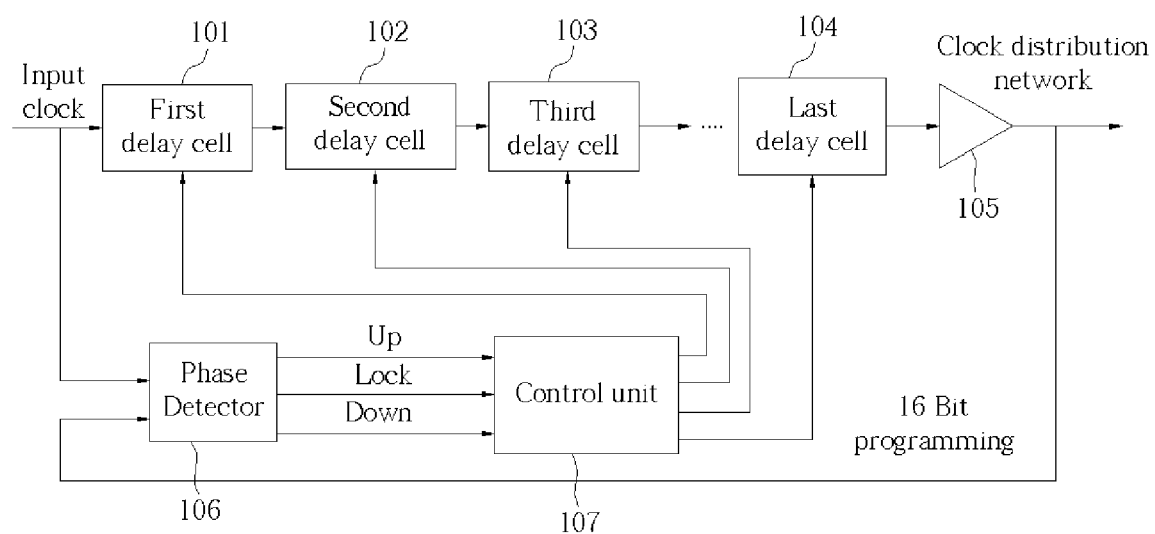
FIG. 1 is a schematic diagram of the multi-stage clock generator according to one embodiment of the present invention.

Please refer to FIG. 1, which shows a schematic diagram of a multi-stage clock generator. The multi-stage clock generator of the present invention comprises a delay chain made of a plurality of delay cells, a phase detector 106, a control unit 107, and a clock distribution network 105. The delay cells 101, 102, 103 . . . , 104 are programmable to have a predetermined resolution at the initialization process. The first delay cell 101 receives an external clock signal and outputs a delay signal and all the subsequent delay cells perform the operation. Each delay cell is divided into a plurality of steps and the steps of each subsequent delay cells become smaller and smaller.

Figure 2:
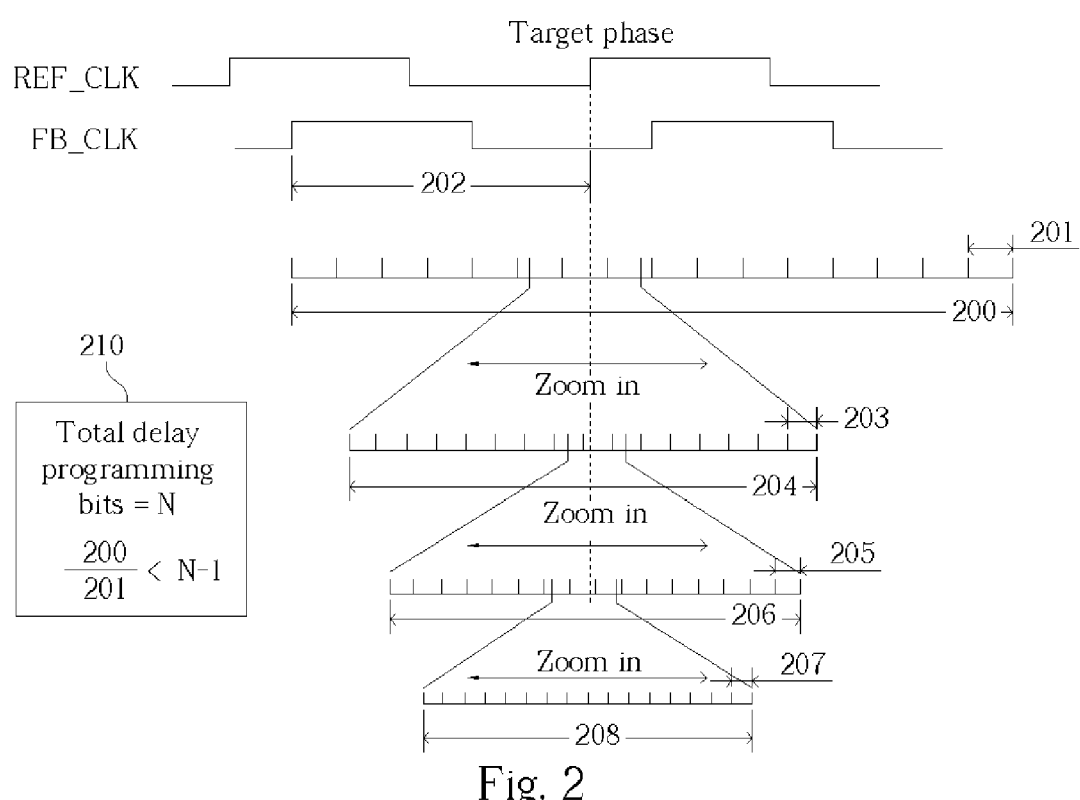
FIG. 2 is a schematic showing the different delay cells according to one embodiment of the present invention.

Please refer to FIG. 2, a delay chain is divided into multiple segments in order to reduce the number of programming bits of the delay cell. The delay chain is divided into several segments with related resolution. The first programmable delay cell 101 is in charge of the largest step delay resolution 201. The minimum total range with respect to the fastest process corner should be larger than the maximum delay target. The second order cell of the delay would catch up the phase with a smaller step 203. The controlling of the third order cell is the same as second order cell, but an even smaller step is provided. The delay step should be smaller than the system-desired jitter. The entire delay cell programming bits come from the same control unit 107.

The algorithm for dividing the delay step is discussed. Firstly, the total number of programming bits is determined. The present invention chooses 16 to be the number of programming bits required. The following equation determines the calculation of the first order delay cell range:

(number of programming bits)−1≧(max delay target)/(size of each delay step of the first programmable delay cell)

It takes fewer steps to reach the delay target. In order to ensure absolutely pull in condition (pull in the target clock into the lock range), the total variation in the range of the second range cell should be 1.5 times of the largest step of the first order delay cell with respect to the slowest process corner. The largest delay step of the first order cell is Δx1st and the smallest total range of the second order delay cell is Σy2nd=1.5×(Δx1st). Each delay step of the second order delay cell is (1.5×(A/8)/16. The minimum total range of the third order delay cell Σy2nd=1.5×(Δx1st) or the minimum total range with respect to the fastest process corner of the third programmable delay cell is equal 1.5 times the largest step of the second programmable delay cell. The delay step dividing rule of the remaining delay cells is similar to the 3 programmable delay cells that were just described.

Figure 3:
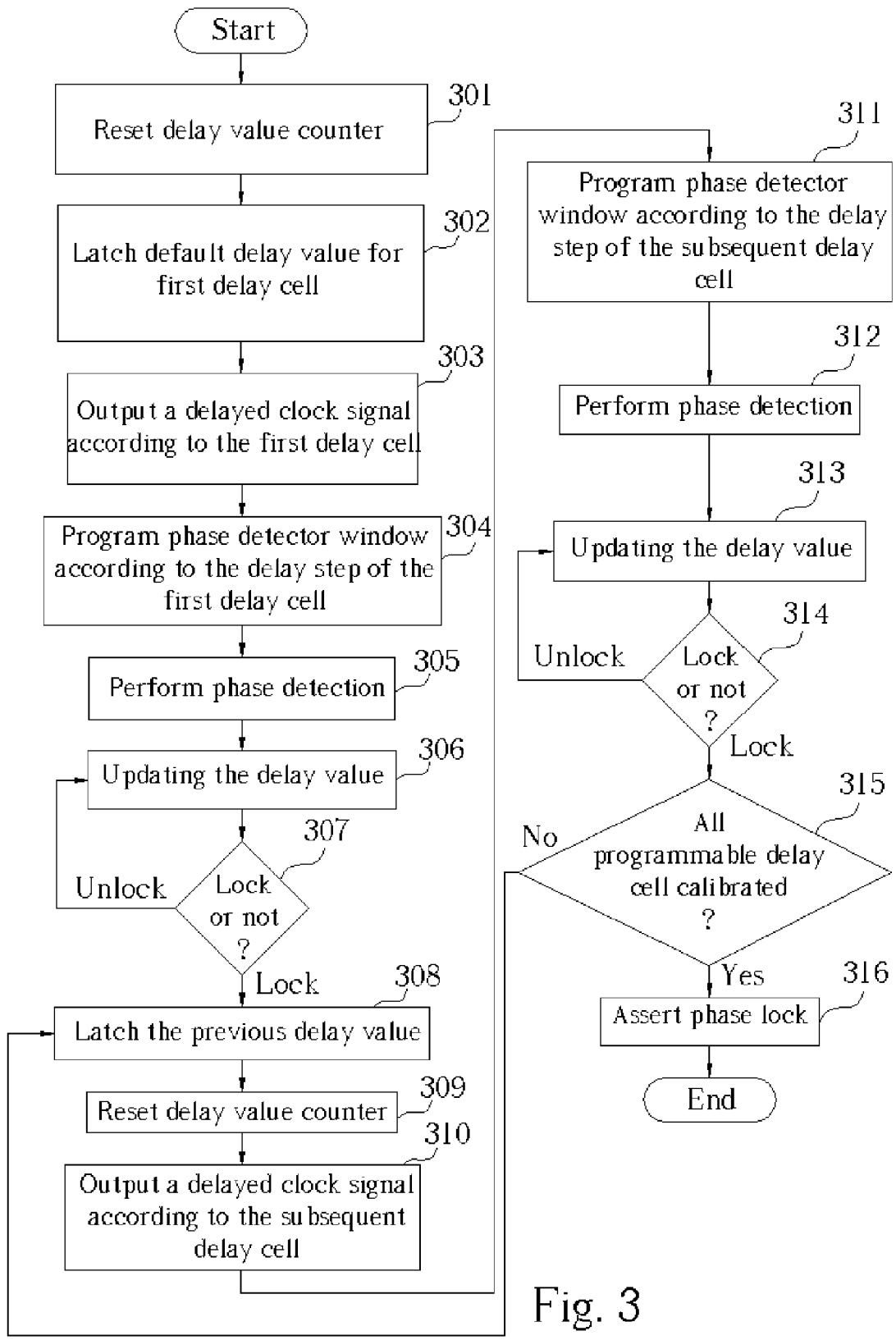
FIG. 3 is a flowchart of the calibration process according to one embodiment of the present invention.

Please refer to FIG. 3, which shows a flowchart of programming the delay value and calibrating the delay chains. After the clock distribution design is done, the scheduled skew between the external clock signal and the feedback clock is extracted. The delay information is predetermined and is used for programming the delay chain. Calibration of the delay chains is done because environment variations such as processes, voltage, and temperature, and the like can seriously affect the accuracy of the delay cell even after the clock distribution design is completed. The multi-phase clock generator enters an initial setup stage after the start up. In step 301, a reset signal is sent to the integrator counter to reset it for initially programming the value of the first programmable delay cell of the delay chain. In step 302, a latch signal is sent from the integration circuit to latch the default delay value for the first programmable delay cell. In step 303, the first programmable delay value channel is selected and the first programmable delay cell outputs a delayed clock signal. In step 304, the phase detector window is programmed according to the delay step of the first programmable delay cell. In step 305, phase detection is performed. In step 306, the delay value is accordingly updated so the flowchart can move to the next programmable delay cell. In step 307, it is determined whether a lock on the external clock signal is successful by the first programmable delay cell. If the lock is not successful, the flow reverts to step 306 until the delay value matches the clock for a lock.

After the first programmable delay cell is calibrated, the second programmable delay cell is calibrated and each subsequent programmable delay cell follows. In step 308, the delay value of the first programmable is latched. In step 309, a lock signal is sent to the integrator to reset the integrator for the second programmable delay cell. In step 310, the second programmable delay value channel is selected and the second programmable delay cell outputs a delayed clock signal. In step 311, the phase detector window is programmed according to the delay step of the second programmable delay cell. In step 312, phase detection is performed. In step 313, the delay value is accordingly updated so the flowchart can move to the next programmable delay cell. In step 314, it is determined whether a lock on the external clock signal is successful by the second programmable delay cell. If the lock is not successful, the flow reverts to step 313 until the delay value matches the clock for a lock. The process repeats until all the programmable delay cells are calibrated. In step 315, determine whether all programmable delay cells are calibrated. If yes proceed to step 316 where the clock lock is completed and if no the flow reverts back to step 308. The calibration process can calibrate any delay chain regardless of length. The external factors that cause delay deviations are eliminated by the calibration process of the present invention to increase phase alignment accuracy.

Figure 4:
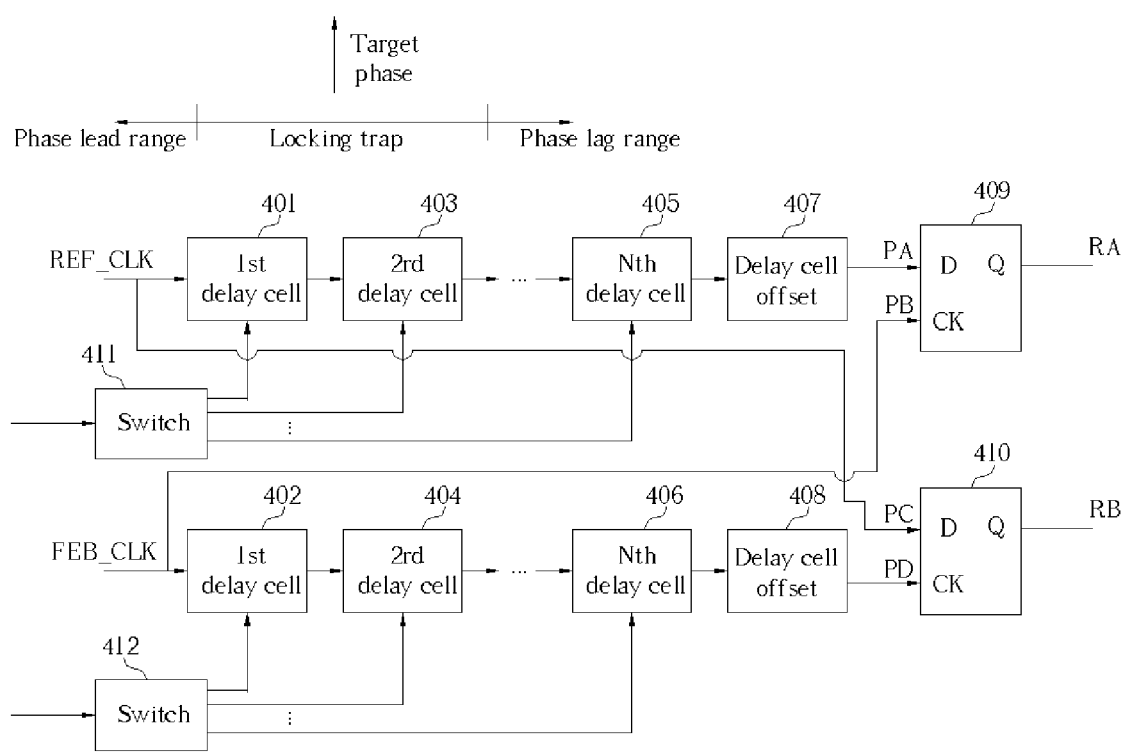
FIG. 4 is a schematic diagram of the phase detector according to one embodiment of the present invention.

Please refer to FIG. 4, which shows the phase detector with a programmable sensing window. The phase detector comprises a first delay chain and a second delay chain, where the delay chain comprises a plurality of delay cells 401, 403 . . . , 405 and the delay chain comprises a plurality of delay cells 402, 404 . . . , 406. A switch 411 is electrically coupled to each of the delay cells 401, 403 . . . , 405 of the first delay chain and a switch 412 is electrically coupled to each of the delay cells 402, 404 . . . , 406 of the second delay chain. Delay offsets 407 and 408 are electrically coupled to the last delay cell of the first and the second delay chains respectively for adding an extra delay to the delay chain to widen the width of the sensing window. A first phase detector 409 is electrically coupled to the first delay chain via the delay cell offset 407 and a second phase detector 410 is electrically coupled to the second delay chain via the delay cell offset 408. The phase detectors 409 and 410 are flip-flops which receive two inputs and send one output which is compared to determine if the feedback clock is in a lead, lock, or lag condition.

The phase detector 409 receives the clock signal PA and PB and outputs the clock signal RA and the phase detector 410 receives the clock signal PC and PD and outputs the clock signal RB. If RA=1 and RB=1, the feedback clock signal is in lead. The clock and data net of the first delay chain comprises the same number of programmable delay cells as the second delay chain. When performing locking of the first order delay cell, the clocking net of the first delay chain and the data net of the second delay chain are programmed to form a sensing window for trapping the clock phase to lock. The phase detector 409 samples the clock signal PA, which is the delayed external clock signal, by the clock signal PB, which is the original feedback clock signal. In the situation where the delayed external clock signal PA is behind of the original feedback clock signal with one delay offset inserted by the delay cell offset 407, the phase detector 409 outputs a 0. Oppositely, if the clock signal PD, which is the delayed feedback signal is ahead of the clock signal PC, which is the original external clock signal with one delay offset inserted by the delay cell offset 408, the phase detector 410 outputs a 1 where RA=0 and RB=1 which represents a lock condition. In a lag condition, the delayed feedback clock signal PD shifts left therefore making RA=1. In a lead condition, the delayed feedback clock signal PD shift right therefore making RA=1. In special situations where the lagging clock phase fails to align with the left edge of the sensing window or the leading clock phase fails to align to the right edge of the sensing window, the programmable sensing window only outputs RA=1, RB=1, i.e. leading or RA=0, RB=0, i.e. lagging to happen. If locking does not happen with the current size of the sensing window, the delay cell offsets 407 and 408 add one more delay offset to sensing window to extend the size for easier locking. Since the sensing window is widened, the clock phase can be easily fall into the sensing window so locking can be achieved. Due to the decreasing resolution of each programmable delay cell, the width of the sensing window should be varied accordingly to ensure efficient locking. However if the sensing window is larger than the step of the programmable delay cell, locking condition will occur outside of the sensing window (i.e. more than 1 programming bit) and the subsequent delay cell will fail to lock. Oppositely, if the sensing window is smaller than the step of the programmable delay cell, no lock condition can be achieved.

Figure 5:
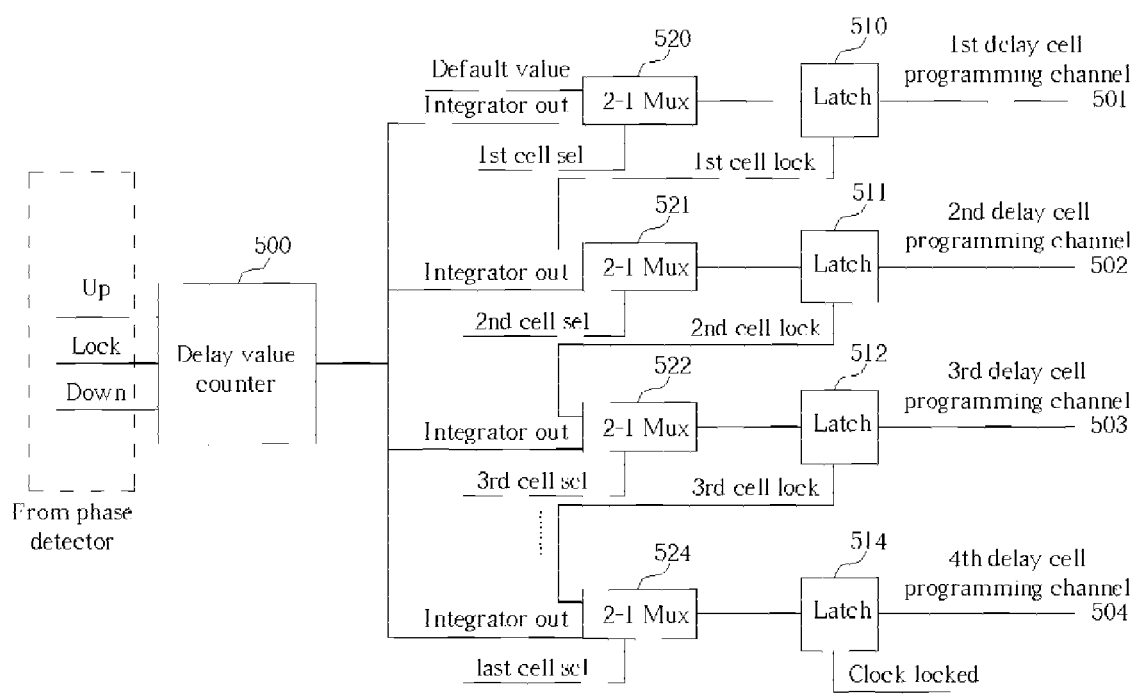
FIG. 5 is an magnified view of the control unit in FIG. 1.

Please refer to FIG. 5, which shows the control unit 107 that uses fewer bits to save memory usage. The control unit 107 comprises a delay value counter 500 electrically coupled to the phase detector 106 to receive a lock control signal and outputs a delay control signal to a plurality of multiplexers which are further electrically coupled to a plurality of latches, wherein each multiplexer is electrically coupled to one latch and forms a branch from the delay value counter 500 to each of the delay cell programming channel. The first branch from the delay value counter 500 electrically couples to the programming channel of the first delay cell via the multiplexer 520 and the latch 510. The multiplexer 520 selects from two inputs: a default value that is 0 and a first cell signal for the first delay cell and outputs a select signal to the latch. The latch 510 receives the select signal from the multiplexer 520 and then latches the delay value of which is sent to the first delay cell programming channel to program the first delay cell and sends a first lock value to the multiplexer of the next branch belonging to the subsequent delay cell. The first lock value sent by the latch 510 is used as the input value to the multiplexer 521. At the same time, the following delay cell value remains at the lowest bit. After the first delay lock determination is completed, the related register tunes the sensing window for the second delay cell programming channel 502. The programming bits are used repeatedly stage by stage until all the programming bits of all the delay cells are determined. The programmability of the present invention allows the use of only 1 set of delay counter controlling circuit so the complexity is greatly reduced.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A multi-stage delay clock generator comprising:
   a plurality of delay cells, each delay cell generating a delay signal to a subsequent delay cell in response to a delayed clock signal from a preceding delay cell and a delay control signal where a first delay cell among the plurality of delay cells receives an external clock signal, wherein each delay cell is divided into a plurality of delay steps and each subsequent delay cell comprises a smaller delay step than the current delay cell;
   a phase detector, responsive to the external clock signal and a feedback clock signal, for generating a Jock control signal; and
   a control unit, responsive to the lock control signal, for generating the delay control signal for programming the delay cells.

2. The multi-stage delay clock generator in claim 1, wherein the control unit comprises:
   a delay counter, responsive to the lock control signal, for generating the delay control signal;
   a plurality of multiplexers, responsive to the delay control signal, for outputting a select signal; and
   a plurality of latches, responsive to the select signal, for outputting a lock signal to the plurality of delay cells and to a subsequent multiplexer.

3. The multi-stage delay clock generator in claim 1, wherein a range of the first delay cell is greater than a range of a maximum delay target from the external clock signal.

4. The multi-stage delay clock generator in claim 1, wherein the delay step of a last delay cell is smaller than a system jitter.

5. The multi-stage delay clock generator in claim 1, wherein the delay step of the first delay cell is determined by a total number of programming bits.

6. The multi-stage delay clock generator in claim 5, wherein the total number of programming bits is a value from dividing the range of the maximum delay target by the delay step of the first delay cell.

7. The multi-stage delay clock generator in claim 1, wherein a number of delay cells is dependent on a resolution of the last delay cell.

8. The multi-stage delay clock generator in claim 1 further comprises a delay offset electrically coupled to a last delay cell for generating an offset delay signal.

9. A method for generating a delay signal comprising:
comparing an external clock signal and a feedback to determine a maximum delay target;
dividing a first delay cell into a plurality of delay steps according to a number of programming bits that is obtained from the maximum delay target;
repeatedly dividing a subsequent delay cell into a plurality of smaller delay steps according to a size of the delay steps of the first delay cell, wherein each subsequent delay cell comprises smaller and smaller delay steps;
comparing the external clock signal to the delay step of the delay cells by a tunable detecting window to output a lock control signal;
latching the delay cell according to the lock control signal;
adjusting a width of the tunable detecting window for the subsequent delay cells; and
sending a delay control signal to the delay cells.

10. The method of claim 9 further comprises initially programming the delay cells.

11. The method of claim 10, wherein initially programming the delay cells comprises:
asserting a reset signal to the first delay cell;
calibrating the first delay cell;
latching a delay value of the first delay cell; and
asserting the reset signal to the subsequent delay cell until all delay cells are calibrated.

12. The method of claim 9, wherein a delay step of the first delay cell is determined by a total number of programming bits.

13. The method of claim 9 further comprises a delay offset electrically coupled to a last delay cell for generating an offset delay signal used for preventing a trap causing lock-failure.

14. A multi-stage delay clock generator for generating a delay signal, comprising:
a first delay chain for generating a first delay signal, in response to an external clock signal and a first delay control signal, comprising a plurality of delay cells, each delay cell generating a delayed clock signal from a preceding delay cell and a delay control signal, wherein each delay cell being divided into a plurality of delay steps and each subsequent delay cell comprises a smaller delay step than the current delay cell;
a second delay chain for generating a second delay signal, in response to a second delay control signal and a feedback clock signal, comprising a plurality of delay cells, each delay cell generating a delayed clock signal to a subsequent delay cell in response to a delayed clock signal from a preceding delay cell and a delay control signal, wherein each delay cell being divided into a plurality of delay steps and each subsequent delay cell comprises a smaller delay step than the current delay cell;
a first phase detector, responsive to a delayed external clock signal and the first delay signal, for generating a first control signal;
a second phase detector, responsive to a delayed feedback clock signal and the second delay signal, for generating a second control signal; and
a control unit, responsive to the first and the second control signals, for generating the first delay control signal and the second delay control signal for programming the delay cells.

15. The multi-stage delay clock generator in claim 14, wherein the control unit comprises:
a delay counter, responsive to a lock control signal, for generating the first and second delay control signals;
a plurality of multiplexers, responsive to the delay control signal, for outputting a select signal; and
a plurality of latches, responsive to the select signal, for outputting the lock signal to the plurality of delay cells and to a subsequent multiplexer.

16. A multi-stage delay clock generator comprising:
a plurality of delay cells, each delay cell generating a delay signal to a subsequent delay cell in response to a delayed clock signal from a preceding delay cell and a delay control signal where a first delay cell among the plurality of delay cells receives an external clock signal, wherein each subsequent delay cell comprises a smaller delay step than the current delay cell;
a phase detector, responsive to the external clock signal and a feedback clock signal, for generating a lock control signal; and
a control unit, comprising:
a delay counter, responsive to the lock control signal, for generating a delay control signal;
a plurality of multiplexers, responsive to the delay control signal, for outputting a select signal; and
a plurality of latches, responsive to the select signal, for outputting a lock signal to the plurality of delay cells and to a subsequent multiplexer.

17. A multi-stage delay clock generator comprising:
a plurality of delay cells, each delay cell generating a delay signal to a subsequent delay cell in response to a delayed clock signal from a preceding delay cell and a delay control signal where a first delay cell among the plurality of delay cells receives an external clock signal, wherein each subsequent delay cell comprises a smaller delay step than the current delay cell;
a phase detector, responsive to the external clock signal and a feedback clock signal, for generating a lock control signal;
a control unit, responsive to the lock control signal, for generating the delay control signal for programming the delay cells; and
a delay offset electrically coupled to a last delay cell for generating an offset delay signal.

18. A multi-stage delay clock generator for generating a delay signal, comprising:
a first delay chain for generating a first delay signal, in response to an external clock signal and a first delay control signal, comprising a plurality of delay cells, each delay cell generating a delayed clock signal from a preceding delay cell and a delay control signal, wherein each subsequent delay cell comprises a smaller delay step than the current delay cell;
a second delay chain for generating a second delay signal, in response to a second delay control signal and a feedback clock signal, comprising a plurality of delay cells, each delay cell generating a delayed clock signal to a subsequent delay cell in response to a delayed clock signal from a preceding delay cell and a delay control signal, wherein each subsequent delay cell comprises a smaller delay step than the current delay cell;

a first phase detector, responsive to a delayed external clock signal and the first delay signal, for generating a first control signal;

a second phase detector, responsive to a delayed feedback clock signal and the second delay signal, for generating a second control signal; and a control unit comprising:

a delay counter, responsive to a lock control signal, for generating the first and second delay control signals;

a plurality of multiplexers, responsive to the delay control signal, for outputting a select signal; and a plurality of latches, responsive to the select signal, for outputting the lock signal to the plurality of delay cells and to a subsequent multiplexer.

* * * * *